(12) United States Patent
Mejia et al.

(10) Patent No.: US 10,739,800 B2
(45) Date of Patent: Aug. 11, 2020

(54) REGULATING AN OUTPUT POWER OF A MONITORED ELECTRONIC DEVICE

(71) Applicant: Hewlett-Packard Development Company, L.P., Houston, TX (US)

(72) Inventors: Robert G Mejia, Boise, ID (US); Jim Jensen, Boise, ID (US); Fernando Bolanos, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/097,528

(22) PCT Filed: Jul. 21, 2016

(86) PCT No.: PCT/US2016/043258
§ 371 (c)(1),
(2) Date: Oct. 29, 2018

(87) PCT Pub. No.: WO2018/017088
PCT Pub. Date: Jan. 25, 2018

(65) Prior Publication Data
US 2019/0146529 A1    May 16, 2019

(51) Int. Cl.
*G05F 1/46* (2006.01)
*G05F 1/573* (2006.01)
*G01R 19/165* (2006.01)

(52) U.S. Cl.
CPC ......... *G05F 1/46* (2013.01); *G01R 19/16523* (2013.01); *G05F 1/573* (2013.01)

(58) Field of Classification Search
CPC . G05F 1/46; G05F 1/569; G05F 1/625; G01R 19/16523; H02M 2001/0009
See application file for complete search history.

(56) References Cited

U.S. PATENT DOCUMENTS

| 4,253,055 A * | 2/1981 | Gatten | H02M 3/137 323/284 |
| 4,331,888 A * | 5/1982 | Yamauchi | G01K 7/01 307/651 |

(Continued)

FOREIGN PATENT DOCUMENTS

| CN | 1152362 A | 6/1997 |
| CN | 1841896 A | 10/2006 |

(Continued)

OTHER PUBLICATIONS

Huang, et al., A Novel Constant Power Control Citcuit for HID Electronic Ballast, 2007,http://ieeexplore.ieee.org/1 page.

*Primary Examiner* — Yusef A Ahmed
(74) *Attorney, Agent, or Firm* — Trop Rea Bentley & Kim LLC

(57) ABSTRACT

A power monitor circuit, includes a power delivery path including an input voltage, a first resistor, and a load. The power monitor circuit further includes a comparator to measure a voltage across the first resistor. The comparator includes an inverting input to measure a voltage on a first side of the first resistor, a non-inverting input to measure a voltage on a second side of the first resistor, a threshold input to receive a threshold input voltage level, and an output to generate a trip signal when the voltage across the first resistor meets the threshold input voltage input level. The power monitor circuit further includes a sub-circuit in series with the first resistor, the sub-circuit including a second resistor coupled to a Zener diode, the sub-circuit to feed the input voltage back into the inverting input of the comparator. A third resistor connected between the first resistor and the second resistor, divides down the input voltage, and a fourth resistor is connected between the sub-circuit and the thresh- (Continued)

old input of the comparator. The fourth resistor is to set a voltage at which the trip signal is generated.

9 Claims, 4 Drawing Sheets

(56) References Cited

U.S. PATENT DOCUMENTS

| | | | | |
|---|---|---|---|---|
| 4,398,711 | A * | 8/1983 | Horst | B65H 7/12 250/559.27 |
| 4,870,532 | A * | 9/1989 | Beatty, Jr. | H02H 3/044 361/93.7 |
| 5,010,279 | A * | 4/1991 | Lathom | G05F 1/08 315/227 R |
| 5,307,257 | A * | 4/1994 | Fukushima | H02M 7/2176 323/300 |
| 5,604,428 | A * | 2/1997 | Koblitz | G05F 1/56 323/314 |
| 5,722,378 | A * | 3/1998 | Sawazaki | F02P 17/12 123/644 |
| 5,838,075 | A * | 11/1998 | Yamasaki | B60R 25/04 307/10.3 |
| 6,150,874 | A * | 11/2000 | Fendt | G05F 1/465 327/314 |
| 6,157,555 | A * | 12/2000 | Hemena | H02J 1/10 307/55 |
| 6,301,133 | B1 * | 10/2001 | Cuadra | H02J 1/102 363/65 |
| 6,946,752 | B2 | 9/2005 | Tahara | |
| 7,095,217 | B1 * | 8/2006 | Niculae | G05F 1/56 323/274 |
| 7,583,067 | B2 | 9/2009 | Niculae et al. | |
| 7,746,613 | B1 * | 6/2010 | Sherwin | H02H 9/004 327/72 |
| 7,821,753 | B2 | 10/2010 | Evans et al. | |
| 8,575,863 | B2 | 11/2013 | Peng | |
| 8,830,776 | B1 * | 9/2014 | Choy | G05F 1/46 365/218 |
| 2001/0010458 | A1 * | 8/2001 | Ohshima | H03K 17/0822 323/282 |
| 2005/0073428 | A1 * | 4/2005 | Sugimoto | G01R 15/04 340/815.45 |
| 2005/0128657 | A1 * | 6/2005 | Covault | H02H 3/087 361/18 |
| 2006/0171178 | A1 * | 8/2006 | Shvarts | H02J 1/10 363/65 |
| 2006/0174143 | A1 * | 8/2006 | Sawyers | G06F 1/26 713/300 |
| 2006/0181256 | A1 * | 8/2006 | Nagai | H02M 3/157 323/283 |
| 2006/0250738 | A1 * | 11/2006 | Hussein | H02H 9/001 361/93.1 |
| 2007/0126407 | A1 * | 6/2007 | Loong | G05F 5/00 323/210 |
| 2007/0213946 | A1 * | 9/2007 | Saether | G01R 19/16538 702/60 |
| 2008/0186644 | A1 * | 8/2008 | Migliavacca | G05F 1/571 361/86 |
| 2010/0148744 | A1 * | 6/2010 | Kresse | G05F 3/30 323/313 |
| 2013/0328492 | A1 | 12/2013 | Hsieh et al. | |
| 2014/0168041 | A1 * | 6/2014 | Chen | G09G 3/3696 345/87 |
| 2016/0072274 | A1 | 3/2016 | Chang et al. | |
| 2017/0245379 | A1 * | 8/2017 | Kang | G01R 31/025 |
| 2018/0081385 | A1 * | 3/2018 | Peng | G05F 3/26 |
| 2018/0131367 | A1 * | 5/2018 | Schnaitter | H03K 17/223 |
| 2018/0145026 | A1 * | 5/2018 | Chen | H01L 23/5256 |
| 2018/0145668 | A1 * | 5/2018 | Chan | H03K 17/08122 |
| 2018/0366938 | A1 * | 12/2018 | Bolanos | G01R 19/165 |

FOREIGN PATENT DOCUMENTS

| | | |
|---|---|---|
| CN | 101432747 A | 5/2009 |
| CN | 101584096 A | 11/2009 |
| CN | 101907900 | 12/2012 |
| CN | 202738176 U | 2/2013 |
| CN | 105514942 A | 4/2016 |
| JP | 2013013288 A | 1/2013 |
| RU | 2011213 C1 | 4/1994 |
| WO | WO-95/31762 | 11/1995 |
| WO | WO-2014121662 A1 | 8/2014 |

* cited by examiner

US 10,739,800 B2

REGULATING AN OUTPUT POWER OF A MONITORED ELECTRONIC DEVICE

BACKGROUND

Regulatory safety requirements specify limits and regulations in terms of output power, rather than in terms of output current or output voltage. For example, Underwriter Laboratories (UL) 62386-1 classifies electronic products as "PS2 Products" when the output power delivered by the products is limited to under one hundred watts. UL tests the PS2 circuit, and the PS2 circuit must shut down its output within five seconds of the application of a hundred watt load.

Many PS2 devices monitor their output power by including a current sensing device in the power delivery path, and shut down when the sensed current exceeds a threshold that indicates that the output power is at or near the limit. The current (e.g., in amps) is equal to the power (e.g., in watts) divided by the voltage (e.g., in volts). Thus, as an example, a PS2 product with a 24 volt input power supply might be designed such that the current monitor circuit trips at no more than 4.16 amps (i.e., 100 watts/24 volts).

DETAILED DESCRIPTION

As discussed above, many PS2 devices monitor their output power by including a current sensing device in the power delivery path, and shut down when the sensed current exceeds a threshold that indicates that the output power is at or near the limit. For example, a PS2 product with a 24 volt input power supply might be designed such that the current monitor circuit trips at no more than 4.16 amps (i.e., 100 watts/24 volts). However, this design does not account for voltage tolerances in the input power supply, and thus may unnecessarily reduce the available power to downstream devices.

As an example, if the 24 volt input power supply has a tolerance of plus or minus 5%, then designing for the highest possible input voltage would trip the current monitor circuit at 3.97 amps (i.e., 100 watts/25.2 volts), which may be insufficient to power downstream devices. For instance, if the input power supply actually receives the lowest possible input voltage (i.e., 22.8 volts in this example), then the output power when the current monitor trips at 3.97 amps would be 90.5 watts (i.e., 22.8 volts×3.97 amps). Thus, if the downstream device consumes more than 90.5 watts of power, but less than 100 watts, during normal operation, then the PS2 product could not meet design constraints while simultaneously compensating for the tolerances in the input power supply.

Examples of the present disclosure describe a constant power monitor circuit to compensate for tolerances in an input voltage by providing negative feedback to the inverting input of the constant current monitor circuit. In one example, the negative feedback is provided using a resistor and a Zener diode. In particular, as the input voltage increases, the resistor and Zener diode will operate to decrease the tripping current of the constant current monitor circuit. Conversely, as the input voltage decreases, the tripping current will increase. Thus, the tripping current changes dynamically in response to the magnitude of the input voltage, ensuring that downstream devices receive adequate power in a safe and reliable manner. Moreover, the disclosure provides a way to monitor and regulate output power autonomously by the monitor, without additional processing by a controlling device.

Figure 1A:
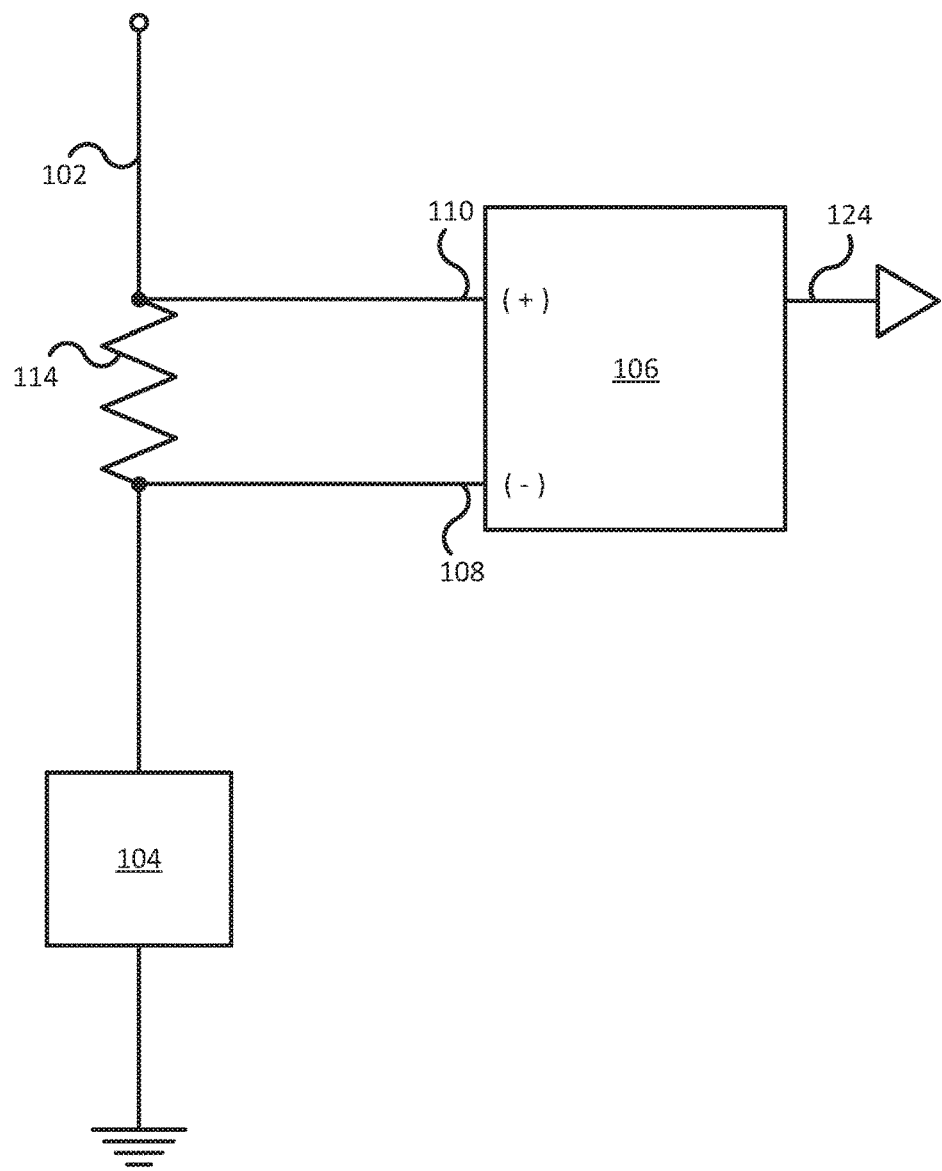
FIG. 1 illustrates an example of constant power monitor circuit of the present disclosure.

FIG. 1A illustrates an example of constant power monitor circuit 100 of the present disclosure. The example circuit 100 may be used to monitor and regulate the output power produced by a monitored device, such as a PS2 device. To this end, the example circuit 100 generally comprises an electric current monitor circuit 102 and a feedback sub-circuit 104.

The electric current monitor circuit 102 includes a comparator 106 having an inverting input 108, a non-inverting input 110, and an output 124. The inverting input 108 and the non-inverting input 110 sense the voltage on opposite sides of a shunt resistor 114, thereby allowing the comparator 106 to measure the differential voltage developed across the shunt resistor 114 when current flows through the shunt resistor 114.

The feedback sub-circuit 104 feeds the input voltage back into the inverting input 108 of the comparator 106. In one example illustrated in greater detail in FIG. 1B, the feedback sub-circuit 104 includes a Zener diode and a resistor.

In operation, the comparator 106 compares the voltage across the shunt resistor 114 to a threshold voltage input level. When the voltage across the shunt resistor 114 meets or exceeds the threshold voltage input level, the comparator 106 "trips," or generates a signal on its output 124 that may be used to regulate the power output of a monitored device. As described in further detail in connection with FIG. 1B, the inclusion of the feedback sub-circuit 104 compensates for tolerance variations of the input voltage by allowing the current at which the electric current monitor circuit 102 trips to adjust dynamically in response to the input voltage.

Figure 1B:
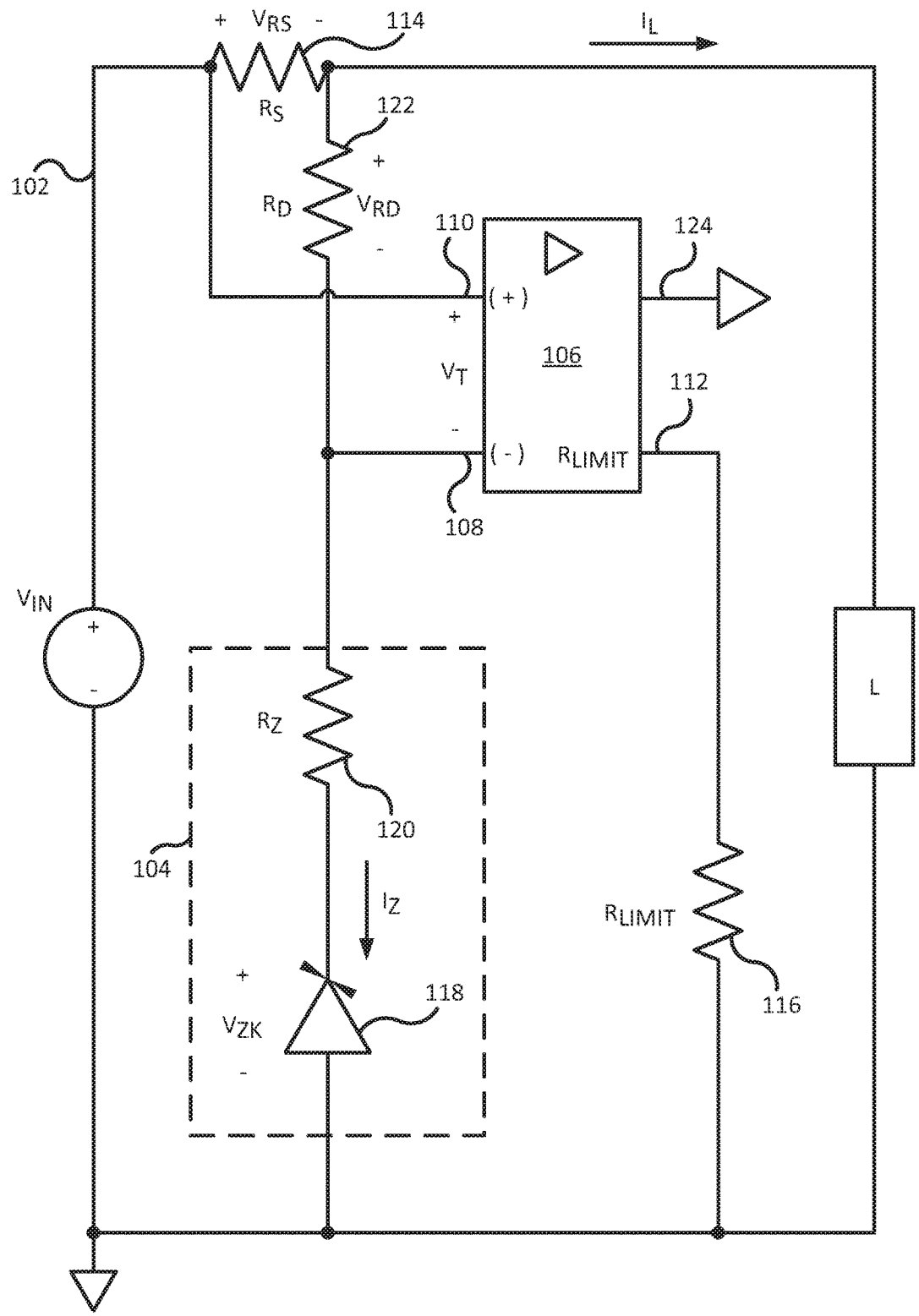

FIG. 1B illustrates a more detailed version of the example of constant power monitor circuit 100 of FIG. 1A. Identical reference numerals are used, where appropriate, to indicate components that are the same as in FIG. 1A. Thus, for example, the example circuit 100 of FIG. 1B generally comprises an electric current monitor circuit 102 and a feedback sub-circuit 104.

The electric current monitor circuit 102 includes a comparator 106 having an inverting input 108, a non-inverting input 110, and a threshold input 112. The inverting input 108 and the non-inverting input 110 sense the voltage on opposite sides of a shunt resistor 114, thereby allowing the comparator 106 to measure the differential voltage $V_{RS}$ developed across the shunt resistor 114 when current flows through the shunt resistor 114. An additional feedback resistor 122 is positioned in series with the shunt resistor 114, between the shunt resistor 114 and the inverting input 108 of the comparator 106, in order to divide down the input voltage $V_{IN}$ from a monitored device as discussed further below. The threshold input 112 receives a signal indicating a threshold voltage input level. In one example, threshold voltage input level is programmable by adjusting a limit-setting resistor 116.

The feedback sub-circuit 104 includes a Zener diode 118 and a resistor 120, referred to herein as a "Zener resistor" due to its coupling with the Zener diode 118. Together, the Zener diode 118 and the Zener resistor 120 feed the input voltage $V_{IN}$ back into the inverting input 108 of the comparator 106. In one example, the Zener diode 118 has a reverse breakdown voltage (or "Zener voltage," i.e., the voltage at which current is permitted to flow from the cathode to the anode of the Zener diode 118) lower than the input voltage $V_{IN}$. In a further example, the reverse breakdown voltage is three to seven volts lower than the input voltage $V_{IN}$, in order to bias the Zener diode 118.

In operation, the comparator 106 compares the voltage $V_{RS}$ across the shunt resistor 114 to the threshold voltage input level indicated by the signal on the threshold input 112. When the voltage $V_{RS}$ across the shunt resistor 114 meets or exceeds the threshold voltage input level, the comparator 106 "trips," or generates a signal on its output 124 that may be used to regulate the power output of a monitored device.

Without the addition of the feedback sub-circuit 104, the electric current monitor circuit 102 would trip at a constant current $I_{TRIP}$ given by:

$$I_{TRIP} = 20 \ \mu A \times \frac{R_{LIMIT}}{R_S} \quad \text{(EQN. 1)}$$

Where 20 µA is assumed to be the current generated by an internal current source, $R_{LIMIT}$ is the resistance value of the limit-setting resistor 116, and $R_S$ is the resistance value of the shunt resistor 114. However, with the addition of the feedback sub-circuit 104, $I_{TRIP}$ becomes:

$$I_{TRIP} = \frac{(20 \ \mu A) \ (R_{LIMIT})}{R_S} - \frac{(R_D)(V_{IN} - V_{ZK})}{(R_S)(R_S + R_D + R_Z)} \quad \text{(EQN. 2)}$$

Where $R_D$ is the resistance value of the feedback resistor 122, $R_Z$ is the resistance value of the Zener resistor 120, and $V_{ZK}$ is the voltage across the Zener diode 118.

From EQN. 2, it can be seen that the current $I_{TRIP}$ to trip the circuit 100 decreases as the input voltage $V_{IN}$ increases. Conversely, the current $I_{TRIP}$ to trip the circuit 100 increases as the input voltage $V_{IN}$ decreases. Thus, the inclusion of the feedback sub-circuit 104 compensates for the tolerance variations of the input voltage $V_{IN}$ by allowing the current at which the electric current monitor circuit 102 trips to adjust dynamically in response to the input voltage $V_{IN}$.

In order to cover the range of the input voltage $V_{IN}$ tolerance as completely as possible, the resistance value of the Zener resistor 120 may be calculated as follows:

$$R_Z = \frac{(R_D)(V_{IN\_H} - V_{IN\_L})}{(R_S)\left(\frac{P_{TRIP}}{V_{IN\_L}} - \frac{P_{TRIP}}{V_{IN\_H}}\right)} \quad \text{(EQN. 3)}$$

Where $V_{IN\_L}$ and $V_{IN\_H}$ are the low and high ends, respectively, of the input voltage tolerance, and $P_{TRIP}$ is the output power at which the circuit 100 is configured to trip.

Referring back to the example 24 volt power supply with the plus or minus 5% tolerance, a corresponding example power monitor circuit may be implemented with an 18 volt (2% tolerance) Zener diode and configured to trip at an output power of 96 watts. Based on EQN. 3, and with a 50 ohm resistor value for the feedback resistor and a 30 milliohm resistor value for the shunt resistor, the resistor value of the Zener resistor would be approximately 10 kiloohms. The electric current monitor in this case would be set for a threshold voltage $V_T$ of:

$$V_T = (R_S)\left(\frac{P_{TRIP}}{V_{IN}}\right) + (R_D)(I_Z) \quad \text{(EQN. 4)}$$

Where $I_Z$ is the current flowing to the Zener diode. Thus, based on EQN. 4, the threshold voltage $V_T$ of the example circuit would be set to 150 millivolts. Where the threshold voltage is controlled by adjusting a limit-setting resistor, the resistor value $R_{LIMIT}$ of the limit-setting resistor may be set to the threshold voltage $V_T$ divided by the current generated by an internal current source. Thus, for a 20 µA internal current source, $R_{LIMIT}$ would be 7.5 kiloohms.

Table 1, below, illustrates the tripping power (i.e., the output power at which the constant power monitor circuit trips) for the low, nominal, and high values of the example 24 volt input power supply with the plus or minus 5% tolerance.

TABLE 1

| Input Voltage Level | $V_{IN}$ (volts) | $I_{TRIP}$ (amps) | $P_{TRIP}$ (watts) |
|---|---|---|---|
| Low | 22.8 | 4.14 | 94.49 |
| Nominal | 24.0 | 4.01 | 96.12 |
| High | 25.2 | 3.87 | 97.42 |

The values shown in Table 1 were calculated accounting for a 2% tolerance in the 18 volt Zener diode. Even with an input voltage tolerance of plus or minus 5%, the tripping power ($P_{TRIP}$) exhibits a very small variation of plus or minus 1.6%. Thus, the power tolerance window is very small in comparison to the input voltage tolerance window.

Figure 2:
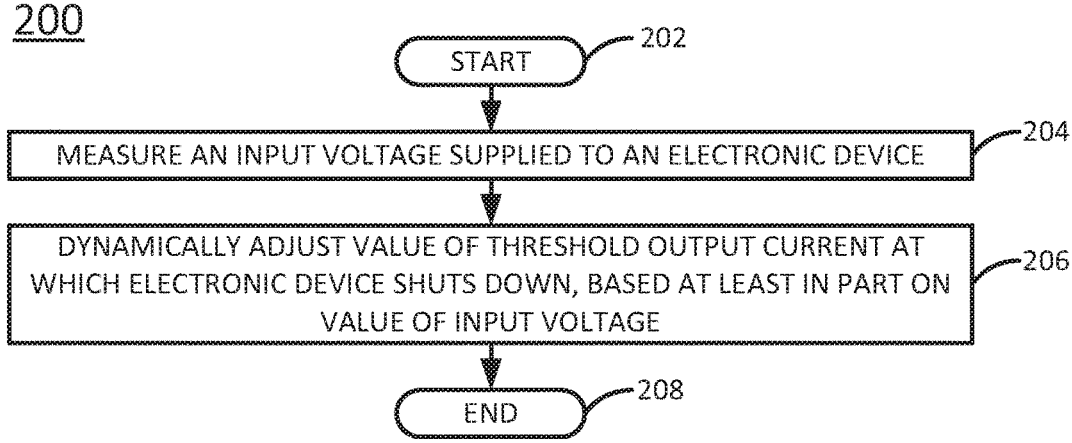
FIG. 2 illustrates a flowchart of a first example method for regulating the output power of an electrical device.

FIG. 2 illustrates a flowchart of a first example method 200 for regulating the output power of an electronic device. The method 200 may be implemented, for example, by a constant power monitor circuit such as the constant power monitor circuit 100 of FIG. 1. In a more specific example, the method 200 may be implemented by the comparator 106 of the constant power monitor circuit 100. As such, and for ease of explanation, reference is made in the discussion of the method 200 to various components of the constant power monitor circuit 100 of FIG. 1.

The method 200 begins in block 202. In block 204, the comparator 106 measures an input voltage supplied to a monitored electronic device. The magnitude of the input voltage may not be constant, but may vary within some range of tolerance (e.g., plus or minus 5% of some set voltage).

In block 206, the comparator 106 dynamically adjusts a tripping current $I_{TRIP}$ of the monitored electronic device, in response to (e.g., based at least in part on) the measured value of the input voltage. In one example, the tripping current $I_{TRIP}$ is calculated according to EQN. 2, above. Thus, the tripping current $I_{TRIP}$ will decrease as the input voltage $V_{IN}$ increases. Conversely, the tripping current $I_{TRIP}$ will increase as the input voltage $V_{IN}$ decreases The method 200 ends in block 208.

Figure 3:
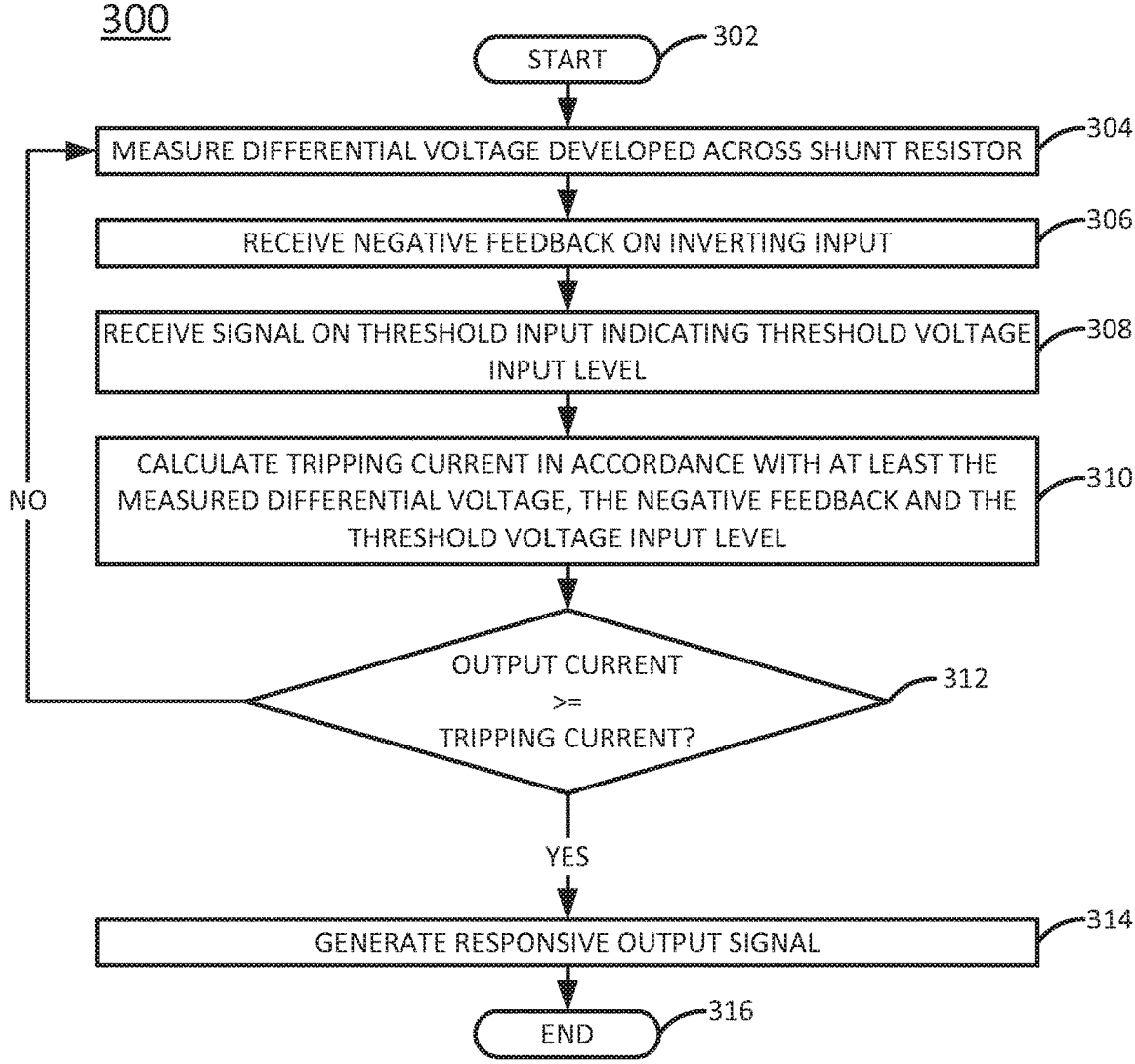
FIG. 3 illustrates a flowchart of a second example method for regulating the output power of an electronic device and FIG. 4 depicts a high-level block diagram of an example computer that can be transformed into a machine capable of performing the functions described herein.

FIG. 3 illustrates a flowchart of a second example method 200 for regulating the output power of an electronic device. The method 300 may be considered as a more detailed version of the method 200 described above. Thus, the method 300 may be implemented, for example, by a constant power monitor circuit such as the constant power monitor circuit 100 of FIG. 1. In a more specific example, the method 300 may be implemented by the comparator 106 of the constant power monitor circuit 100. As such, and for ease of explanation, reference is made in the discussion of the method 300 to various components of the constant power monitor circuit 100 of FIG. 1.

The method 300 begins in block 302. In block 304, the comparator 106 measures the differential voltage $V_{RS}$ developed across the shunt resistor 114, in response to the input voltage $V_{IN}$ being supplied to the monitored electronic device. In particular, the voltages on opposite sides of the shunt resistor 114 are sensed by the inverting input 108 and the non-inverting input 110 of the comparator 106. The voltage measured by the inverting input 108 is divided down by the feedback resistor 122.

In block 306, the comparator 106 receives negative feedback from the feedback sub-circuit 104 (e.g., from the Zener diode 118 and Zener resistor 120). The negative feedback feeds the input voltage $V_{IN}$ back into the inverting input 108 of the comparator 106.

In block 308, the comparator 106 receives a signal on its threshold input 112. The signal on the threshold input 112 indicates a threshold voltage input level, and may be programmed by an adjustment of the limit-setting resistor 116.

In block 310, the comparator calculates the tripping current $I_{TRIP}$ for the monitored electronic device (i.e., the current at which the monitored electronic device should be shut down) in accordance with at least the inputs received in blocks 304-308 (i.e., the differential voltage measured across the shunt resistor 114, the negative feedback provided by the feedback sub-circuit 104, and the signal indicating the threshold input voltage. In one example, $I_{TRIP}$ is calculated according to EQN. 2.

In block 312, the comparator 106 determines whether the output current of the monitored electronic device meets or exceeds the tripping current $I_{TRIP}$ calculated in block 310.

If the comparator 106 concludes in block 312 that the output current of the monitored electronic device is below the tripping current $I_{TRIP}$, then the method 300 returns to block 304, and the comparator continues to monitor the differential voltage across the shunt resistor 114.

If, however, the comparator concludes in block 312 that the output current of the monitored electronic device meets or exceeds the tripping current $I_{TRIP}$, then the method 300 proceeds to block 314. In block 314, the comparator 106 generates a signal on its output 124 responsive to the output current meeting or exceeding the tripping current $I_{TRIP}$. The signal may instruct the monitored electronic device to shut down.

The method 300 ends in block 316.

Figure 4:
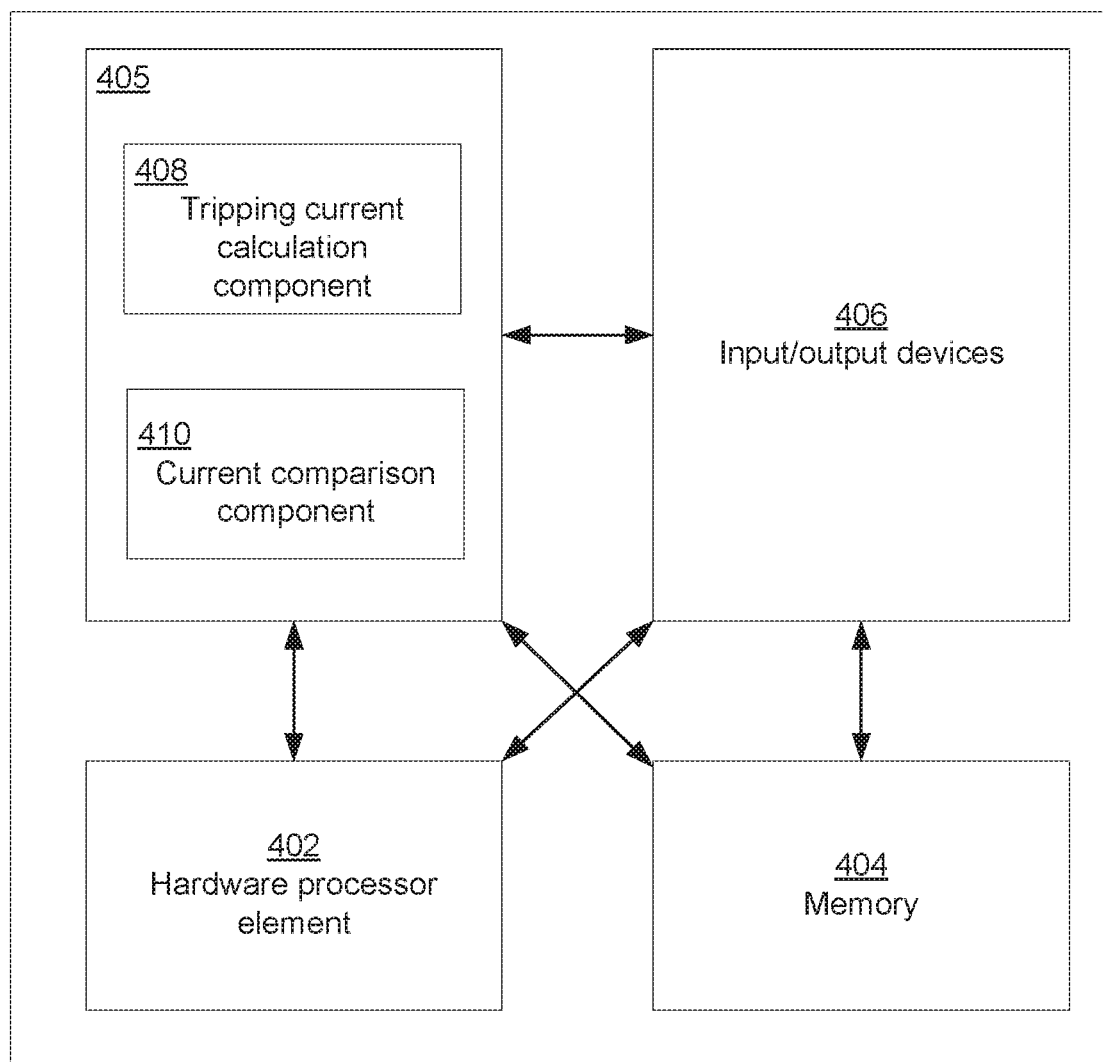

FIG. 4 depicts a high-level block diagram of an example computer 400 that can be transformed into a machine capable of performing the functions described herein. Notably, no computer or machine currently exists that performs the functions as described herein. As a result, the examples of the present disclosure modify the operation and functioning of the general-purpose computer to provide a constant power monitoring circuit, as disclosed herein. Thus, the computer 400 may be implemented in the comparator 106 of the constant power monitor circuit 100 of FIG. 1.

As depicted in FIG. 4, the computer 400 comprises a hardware processor element 402, e.g., a central processing unit (CPU), a microprocessor, or a multi-core processor, a memory 404, e.g., a temporary memory such as random access memory (RAM) and/or read only memory (ROM), a power monitor module 405 for monitoring the output power of an electronic device, and various input/output devices 406, e.g., storage devices, including but not limited to, a persistent memory array, a tape drive, a floppy drive, a hard disk drive or a compact disk drive, a receiver, a transmitter, a speaker, a display, a speech synthesizer, an output port, an input port and a user input device, such as a keyboard, a keypad, a mouse, a microphone, and the like.

Although one processor element is shown, it should be noted that the general-purpose computer may employ a plurality of processor elements. Furthermore, although one general-purpose computer is shown in the figure, if the method(s) as discussed above is implemented in a distributed or parallel manner for a particular illustrative example, i.e., the blocks of the above method(s) or the entire method(s) are implemented across multiple or parallel general-purpose computers, then the general-purpose computer of this figure is intended to represent each of those multiple general-purpose computers. Furthermore, a hardware processor can be utilized in supporting a virtualized or shared computing environment. The virtualized computing environment may support a virtual machine representing computers, servers, or other computing devices. In such virtualized virtual machines, hardware components such as hardware processors and computer-readable storage devices may be virtualized or logically represented.

It should be noted that the present disclosure can be implemented by machine readable instructions and/or in a combination of machine readable instructions and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the blocks, functions and/or operations of the above disclosed methods.

In one example, instructions and data for the present module or process 405 for monitoring the output power of an electronic device, e.g., machine readable instructions can be loaded into memory 404 and executed by hardware processor element 402 to implement the blocks, functions or operations as discussed above in connection with the methods 200 and 300. For instance, the module 405 may include a plurality of programming code components, including a tripping current calculation component 408 and a current comparison component 410.

The tripping current calculation component 408 may be configured to determine at what current the constant power monitor circuit should be tripped, for example as discussed in connection with EQN. 2. The current comparison component 410 may be configured to determine when the output current of the monitored electronic device exceeds the tripping current calculated by the tripping current calculation component 408.

Furthermore, when a hardware processor executes instructions to perform "operations", this could include the hardware processor performing the operations directly and/or facilitating, directing, or cooperating with another hardware device or component, e.g., a co-processor and the like, to perform the operations.

The processor executing the machine readable instructions relating to the above described method(s) can be perceived as a programmed processor or a specialized processor. As such, the present module 405 for monitoring the output power of an electronic device, including associated data structures, of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, or variations therein may be subsequently made which are also intended to be encompassed by the following claims.

What is claimed is:

1. A power monitor circuit, comprising:
a power delivery path including a voltage input, a first resistor, and a load;
a comparator to measure a voltage across the first resistor, the comparator including:
an inverting input to measure a voltage on a first side of the first resistor;
a non-inverting input to measure a voltage on a second side of the first resistor;
a threshold input to receive a threshold input voltage level; and
an output to generate a trip signal when the voltage across the first resistor meets the threshold input voltage level;
a sub-circuit in series with the first resistor, the sub-circuit including a second resistor coupled to the inverting input, and a Zener diode coupled between the second resistor and the load, the sub-circuit to feed an input voltage back into the inverting input of the comparator;
a third resistor connected between the first resistor and the second resistor, the third resistor to divide down the input voltage; and
a fourth resistor connected between the sub-circuit and the threshold input of the comparator, the fourth resistor to set a voltage at which the trip signal is generated;
wherein the comparator is to:
measure a value of a present output current of the load; and
generate the trip signal to shut down the load when the present output current meets the tripping current.

2. The power monitor circuit of claim 1, wherein a resistance of the third resistor is programmable to adjust the threshold input voltage level.

3. The power monitor circuit of claim 1, wherein a reverse breakdown voltage of the Zener diode is programmed to be lower than the input voltage.

4. The power monitor circuit of claim 3, wherein the reverse breakdown voltage is three to seven volts lower than the input voltage.

5. A method, comprising:
in a power delivery path including a voltage input, a first resistor, and an electronic device, measuring an input voltage supplied to the electronic device, by:
at an inverting input of a comparator, measuring a voltage on a first side of the first resistor; and
at a non-inverting input of the comparator, measuring a voltage on a second side of the first resistor;
using a sub-circuit in series with the first resistor, feeding the input voltage back into the inverting input of the comparator, the sub-circuit including a second resistor coupled to the inverting input, and a Zener diode coupled between the second resistor and the electronic device;
generating at an output of the comparator, an output signal responsive to the input voltage meeting or exceeding a threshold input voltage received at a threshold input of the comparator;
determining a tripping current of the electronic device based at least in part on a resistance value of the first resistor, a resistance value of the second resistor, a resistance value of a limit-setting resistor coupled to the threshold input of the comparator, the comparator coupled to the voltage input and to the Zener diode;
measuring a value of a present output current of the electronic device; and
generating the output signal to shut down the electronic device when the present output current meets the tripping current.

6. The method of claim 5, including responsive to an increase in the input voltage, decreasing a current in the power delivery path at which the output signal is generated.

7. The method of claim 5, including responsive to a decrease in the input voltage, increasing a current in the power delivery path at which the output signal is generated.

8. The method of claim 5, including adjusting the threshold input voltage by adjusting the resistance value of the limit-setting resistor coupled to the threshold input of the comparator.

9. A system, comprising:
a voltage input;
a load; and
a power delivery path between the voltage input and the load, the power delivery path including:
a comparator to measure a voltage across a first resistor, the comparator including an inverting input to measure a first voltage on a first side of the first resistor, a non-inverting input to measure a second voltage on a second side of the first resistor, and an output to generate a trip signal;
a sub-circuit, including a second resistor coupled to the inverting input, and a Zener diode coupled between the second resistor and the load;
a third resistor connected between the first resistor and the second resistor, the third resistor to divide down an input voltage; and
a fourth resistor connected between the sub-circuit and a threshold input of the comparator, the fourth resistor to set a voltage at which the trip signal is generated;
wherein the sub-circuit is to feed the input voltage back to the inverting input, and the output of the comparator is to generate the trip signal responsive to the voltage across the first resistor exceeding a threshold input voltage level; and
wherein the comparator is to:
measure a value of a present output current of the load; and
generate the trip signal to shut down the load when the present output current meets the tripping current.

* * * * *